United States Patent
Chen et al.

(10) Patent No.: US 8,767,485 B1
(45) Date of Patent: Jul. 1, 2014

(54) OPERATION METHOD OF A SUPPLY VOLTAGE GENERATION CIRCUIT USED FOR A MEMORY ARRAY

(71) Applicant: United Microelectronics Corporation, Hsinchu (TW)

(72) Inventors: Shi-Wen Chen, Hsinchu (TW); Hsin-Pang Lu, Hsinchu (TW); Chung-Cheng Tsai, Taichung (TW); Ya-Nan Mou, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/225,432

(22) Filed: Mar. 26, 2014

Related U.S. Application Data

(62) Division of application No. 13/652,422, filed on Oct. 15, 2012, now Pat. No. 8,724,404.

(51) Int. Cl.
| | | |
|---|---|---|
| *G11C 5/14* | (2006.01) | |
| *G11C 8/08* | (2006.01) | |
| *G11C 7/00* | (2006.01) | |
| *G11C 7/10* | (2006.01) | |
| G11C 11/4074 | (2006.01) | |
| G11C 7/08 | (2006.01) | |
| G11C 29/02 | (2006.01) | |

(52) U.S. Cl.
CPC G11C 7/00 (2013.01); G11C 5/147 (2013.01); G11C 8/08 (2013.01); G11C 11/4074 (2013.01); G11C 7/08 (2013.01); G11C 7/10 (2013.01); G11C 29/021 (2013.01)
USPC ............ 365/189.09; 365/189.07; 365/189.11; 365/230.06

(58) Field of Classification Search
CPC ...... G11C 5/147; G11C 11/4074; G11C 7/08; G11C 8/08; G11C 7/10; G11C 29/021
USPC ............................ 365/189.07, 189.09, 230.06
See application file for complete search history.

(56) References Cited

U.S. PATENT DOCUMENTS

| | | |
|---|---|---|
| 3,663,828 A | 5/1972 | Low |
| 3,818,402 A | 6/1974 | Golaski |
| 4,163,944 A | 8/1979 | Chambers |
| 4,245,355 A | 1/1981 | Pascoe |
| 4,409,608 A | 10/1983 | Yoder |
| 4,816,784 A | 3/1989 | Rabjohn |
| 5,159,205 A | 10/1992 | Gorecki |
| 5,208,725 A | 5/1993 | Akcasu |
| 5,212,653 A | 5/1993 | Tanaka |
| 5,406,447 A | 4/1995 | Miyazaki |
| 5,446,309 A | 8/1995 | Adachi |

(Continued)

*Primary Examiner* — Ly D Pham
(74) *Attorney, Agent, or Firm* — Ding Yu Tan

(57) ABSTRACT

A supply voltage generation circuit includes a comparison unit, a voltage level control unit and a voltage regulator circuit. Comparison unit is configured to compare input data and output data of a memory array to each other and thereby generating a comparison result, wherein output data are storage data stored in a plurality of memory units of memory array processed by a program operation according to input data, and the comparison result indicates the number of different bits existing between the output data and the input data. Voltage level control unit is configured to generate a control signal according to the comparison result. Voltage regulator circuit is configured to provide a supply voltage for the memory array and adjust the value of the supply voltage according to the control signal. A memory and an operation method of a supply generation circuit used for a memory array are also provided.

3 Claims, 8 Drawing Sheets

(56) References Cited

U.S. PATENT DOCUMENTS

| | | |
|---|---|---|
| 5,583,359 A | 12/1996 | Ng |
| 5,637,900 A | 6/1997 | Ker |
| 5,760,456 A | 6/1998 | Grzegorek |
| 5,808,330 A | 9/1998 | Rostoker |
| 5,923,225 A | 7/1999 | De Los Santos |
| 5,959,820 A | 9/1999 | Ker |
| 6,008,102 A | 12/1999 | Alford |
| 6,081,146 A | 6/2000 | Shiochi |
| 6,172,378 B1 | 1/2001 | Hull |
| 6,194,739 B1 | 2/2001 | Ivanov |
| 6,246,271 B1 | 6/2001 | Takada |
| 6,285,578 B1 | 9/2001 | Huang |
| 6,291,872 B1 | 9/2001 | Wang |
| 6,370,372 B1 | 4/2002 | Molnar |
| 6,407,412 B1 | 6/2002 | Iniewski |
| 6,427,226 B1 | 7/2002 | Mallick |
| 6,448,858 B1 | 9/2002 | Helms |
| 6,452,442 B1 | 9/2002 | Laude |
| 6,456,221 B2 | 9/2002 | Low |
| 6,461,914 B1 | 10/2002 | Roberts |
| 6,480,137 B2 | 11/2002 | Kulkarni |
| 6,483,188 B1 | 11/2002 | Yue |
| 6,486,765 B1 | 11/2002 | Katayanagi |
| 6,509,805 B2 | 1/2003 | Ochiai |
| 6,518,165 B1 | 2/2003 | Yoon |
| 6,521,939 B1 | 2/2003 | Yeo |
| 6,545,547 B2 | 4/2003 | Fridi |
| 6,560,306 B1 | 5/2003 | Duffy |
| 6,588,002 B1 | 7/2003 | Lampaert |
| 6,593,838 B2 | 7/2003 | Yue |
| 6,603,360 B2 | 8/2003 | Kim |
| 6,608,363 B1 | 8/2003 | Fazelpour |
| 6,611,223 B2 | 8/2003 | Low |
| 6,625,077 B2 | 9/2003 | Chen |
| 6,630,897 B2 | 10/2003 | Low |
| 6,639,298 B2 | 10/2003 | Chaudhry |
| 6,653,868 B2 | 11/2003 | Oodaira |
| 6,668,358 B2 | 12/2003 | Friend |
| 6,700,771 B2 | 3/2004 | Bhattacharyya |
| 6,720,608 B2 | 4/2004 | Lee |
| 6,724,677 B1 | 4/2004 | Su |
| 6,756,656 B2 | 6/2004 | Lowther |
| 6,795,001 B2 | 9/2004 | Roza |
| 6,796,017 B2 | 9/2004 | Harding |
| 6,798,011 B2 | 9/2004 | Adan |
| 6,810,242 B2 | 10/2004 | Molnar |
| 6,822,282 B2 | 11/2004 | Randazzo |
| 6,822,312 B2 | 11/2004 | Sowlati |
| 6,833,756 B2 | 12/2004 | Ranganathan |
| 6,841,847 B2 | 1/2005 | Sia |
| 6,847,572 B2 | 1/2005 | Lee |
| 6,853,272 B1 | 2/2005 | Hughes |
| 6,876,056 B2 | 4/2005 | Tilmans |
| 6,885,534 B2 | 4/2005 | Ker |
| 6,901,126 B1 | 5/2005 | Gu |
| 6,905,889 B2 | 6/2005 | Lowther |
| 6,909,149 B2 | 6/2005 | Russ |
| 6,927,664 B2 | 8/2005 | Nakatani |
| 6,958,522 B2 | 10/2005 | Clevenger |
| 6,967,876 B2 | 11/2005 | Rolandi |
| 7,009,252 B2 | 3/2006 | Lin |
| 7,027,276 B2 | 4/2006 | Chen |
| 7,205,612 B2 | 4/2007 | Cai |
| 7,262,069 B2 | 8/2007 | Chung |
| 7,365,627 B2 | 4/2008 | Yen |
| 7,368,761 B1 | 5/2008 | Lai |
| 7,405,642 B1 | 7/2008 | Hsu |
| 7,672,100 B2 | 3/2010 | Van Camp |
| 7,889,566 B2 | 2/2011 | Kang |
| 2002/0019123 A1 | 2/2002 | Ma |
| 2002/0036545 A1 | 3/2002 | Fridi |
| 2002/0188920 A1 | 12/2002 | Lampaert |
| 2003/0076636 A1 | 4/2003 | Ker |
| 2003/0127691 A1 | 7/2003 | Yue |
| 2003/0183403 A1 | 10/2003 | Kluge |
| 2005/0068112 A1 | 3/2005 | Glenn |
| 2005/0068113 A1 | 3/2005 | Glenn |
| 2005/0087787 A1 | 4/2005 | Ando |
| 2006/0006431 A1 | 1/2006 | Jean |
| 2006/0108694 A1 | 5/2006 | Hung |
| 2006/0267102 A1 | 11/2006 | Cheng |
| 2007/0102745 A1 | 5/2007 | Hsu |
| 2007/0210416 A1 | 9/2007 | Hsu |
| 2007/0234554 A1 | 10/2007 | Hung |
| 2007/0246801 A1 | 10/2007 | Hung |
| 2007/0249294 A1 | 10/2007 | Wu |
| 2007/0296055 A1 | 12/2007 | Yen |
| 2008/0094166 A1 | 4/2008 | Hsu |
| 2008/0185679 A1 | 8/2008 | Hsu |
| 2008/0189662 A1 | 8/2008 | Nandy |
| 2008/0200132 A1 | 8/2008 | Hsu |
| 2008/0299738 A1 | 12/2008 | Hsu |
| 2008/0303623 A1 | 12/2008 | Hsu |
| 2009/0029324 A1 | 1/2009 | Clark |
| 2009/0201625 A1 | 8/2009 | Liao |
| 2010/0142283 A1 | 6/2010 | Ha |
| 2010/0279484 A1 | 11/2010 | Wang |

OPERATION METHOD OF A SUPPLY VOLTAGE GENERATION CIRCUIT USED FOR A MEMORY ARRAY

CROSS-REFERENCE TO RELATED APPLICATIONS

This application is a divisional of, and claims the benefit of U.S. Nonprovisional application Ser. No. 13/652,422 entitled "MEMORY, SUPPLY VOLTAGE GENERATION CIRCUIT, AND OPERATION METHOD OF A SUPPLY VOLTAGE GENERATION CIRCUIT USED FOR A MEMORY ARRAY" and filed on Oct. 15, 2012, the disclosure of which is hereby incorporated by reference herein in its entirety.

FIELD OF THE INVENTION

The present invention relates to an operation method of a supply voltage generation circuit used for a memory array.

BACKGROUND OF THE INVENTION

Non-volatile memory is capable of storing data without being supplied with external electrical power. Because of having the feature of no external power consumption, the non-volatile memory is particularly applicable to be used in portable apparatuses.

The non-volatile memory can have three operations: read, write and erase; wherein the write operation is also referred to as the program operation. Basically, the three operations of the non-volatile memory require respective different voltages. Because the non-volatile memory highly demands a more accurate programming voltage level while executing the program operation, the associated programming voltage is required to be much accurate accordingly.

SUMMARY OF THE INVENTION

The present invention provides a supply voltage generation circuit for a memory array and capable of providing a more accurate supply voltage used as a programming voltage.

The present invention also provides an operation method of the aforementioned supply voltage generation circuit.

An embodiment of the present invention provides an operation method of a supply voltage generation circuit used for a memory array. The memory array comprises a plurality of memory units and is electrically coupled to a decoder comprising an input terminal and a plurality of output terminals. Each output terminal of the decoder is electrically coupled to a respective group of the memory units. The operation method includes the following steps: providing, according to input data of the memory array, a supply voltage to the input terminal of the decoder; generating a comparison result by comparing the input data to output data of the memory array, wherein the output data are storage data stored in a plurality of memory units of the memory array processed by a program operation according to the input data, and the comparison result indicates the number of different bits existing between the output data and the input data; and adjusting the value of the supply voltage according to the comparison result if the comparison result indicates that there is at least one different bit existing between the input data and the output data.

In summary, the operation method of the supply voltage generation circuit according to the present invention first generates a comparison result by comparing input data to output data of a memory array; wherein the output data are storage data stored in a plurality of memory units of the memory array processed by a program operation according to the input data, and the comparison result indicates the number of different bits existing between the output data and the input data. Accordingly, the value of the supply voltage can be adjusted according to the comparison result if the comparison result indicates that there is at least one different bit existing between the input data and the output data. Thus, the operation method of the supply voltage generation circuit according to the present invention is capable of providing a more accurate supply voltage used as a programming voltage.

BRIEF DESCRIPTION OF THE DRAWINGS

The embodiments of present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
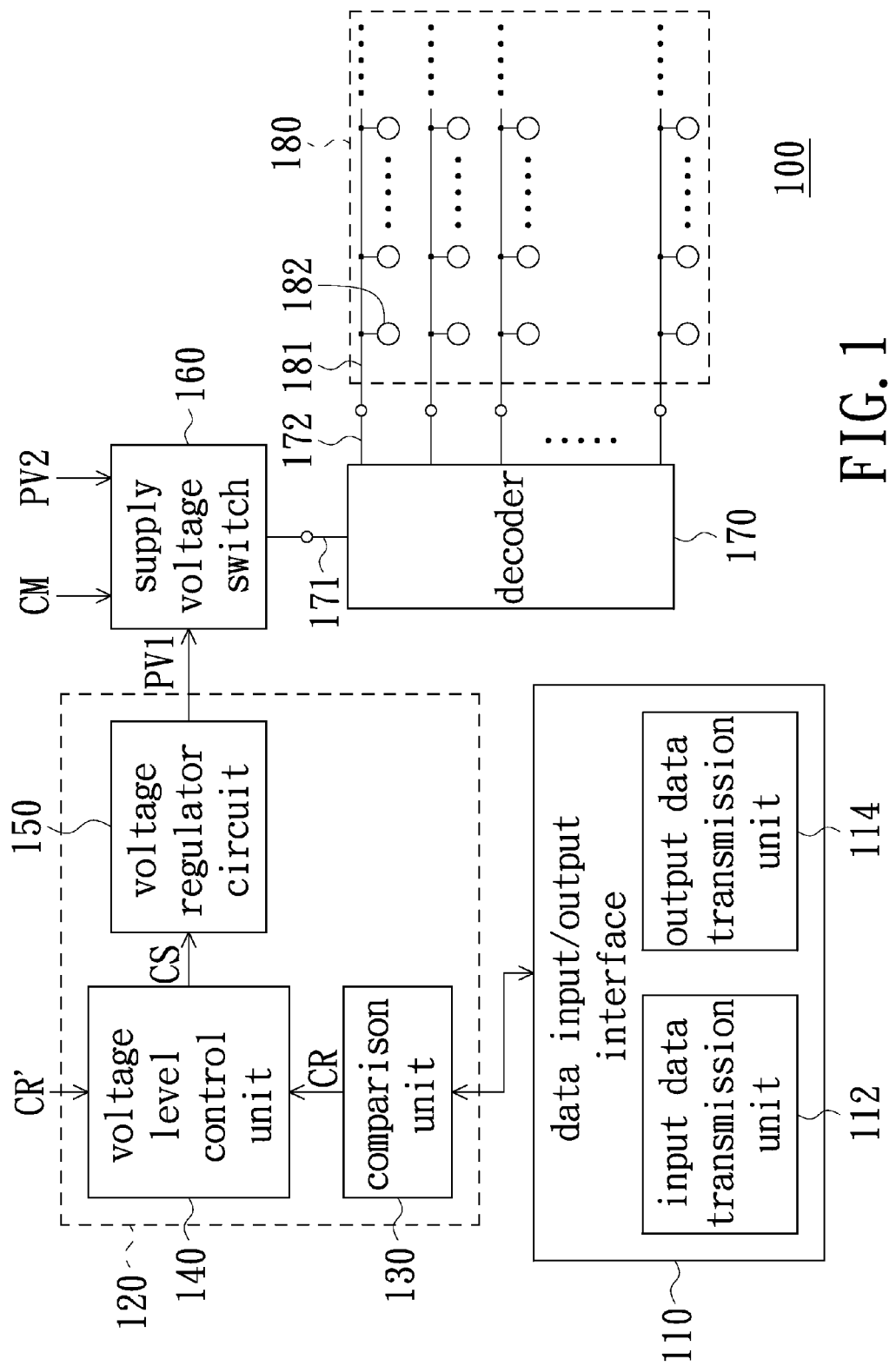
FIG. 1 is a schematic view of a memory array in accordance with an embodiment of the present invention.

FIG. 1 is a schematic view of a memory in accordance with an embodiment of the present invention; wherein it is to be noted that only a portion of the memory circuit structure associated with the present invention is depicted for brevity. As shown, the memory 100 in this embodiment includes a data input/output interface 110, a supply voltage generation circuit 120, a supply voltage switch 160, a decoder 170 and a memory array 180. The memory array 180 includes a plurality of source lines 181 a plurality of memory units 182, and each of the source lines 181 is electrically coupled to a respective group of memory units 182. The decoder 170 has an input terminal 171 and a plurality of output terminals 172. In this embodiment, the decoder 170 is configured to have the output terminals 172 thereof electrically coupled to the source lines 181 of the memory array 180. According to the aforementioned description, it is understood that the decoder 170 is a source line decoder.

The supply voltage switch 160, electrically coupled between an output terminal of the supply voltage generation circuit 120 and the input terminal 171 of the decoder 170, is configured to receive a supply voltage PV1 and a predetermined voltage PV2 and consequently selectively output, according to a control command CM, either the supply voltage PV1 or the predetermined voltage PV2 to the input terminal 171 of the decoder 170. In this embodiment, the supply voltage PV1 is used as a programming voltage; and the predetermined voltage PV2 is used as, for example, a readout voltage.

The supply voltage generation circuit 120 includes a comparison unit 130, a voltage level control unit 140 and a voltage regulator circuit 150. The comparison unit 130 is configured to compare the input data and the output data of the memory array 180 to each other and thereby generating a comparison result CR accordingly. The aforementioned output data are the storage data stored in a plurality of memory unit 182 of the memory array 180 processed by a program operation according to the aforementioned input data; and the comparison result CR indicates the number of different bits existing between the output data and the input data. In addition, the voltage level control unit 140 is configured to generate a control signal CS according to the comparison result CR. The voltage regulator circuit 150 is configured to provide the supply voltage PV1 for the memory array 180 and adjust the value of the supply voltage PV1 according to the control signal CS.

In addition, for obtaining of the aforementioned input data and the output data, the comparison unit 130 is further electrically coupled to the data input/output interface 110, from which to receive the input data and the output data; wherein the data input/output interface 110 is further configured to latch the aforementioned input data. In this embodiment, the data input/output interface 110 further includes an input data transmission unit 112 and an output data transmission unit 114; specifically, the input data transmission unit 112 is configured to transmit and latch the aforementioned input data, and the output data transmission unit 114 is configured to transmit the aforementioned output data.

One exemplified operation process of the supply voltage generation circuit 120 executing the program operation on four memory units 182 is described in the following description. Please refer to FIG. 1, again. The supply voltage generation circuit 120 first, according to the input data of the memory array 180, provides the supply voltage PV1 so as to transmit the supply voltage PV1 used as a programming voltage to the input terminal 171 of the decoder 170. Then, a plurality of (e.g., four) memory units 182 of the memory array 180 can perform a program operation according to the value of the programming voltage, and thereby each memory unit 182 stores one bit of data. Afterwards, the memory 100 transmits the storage data, constituted of the four bits of data stored in the four memory units 182 processed by the program operation according to the input data, to the data input/output interface 110; wherein the storage data herein are referred to as the output data of the memory array 180.

Afterwards, the supply voltage generation circuit 120 first obtains the latched input data from the data input/output interface 110 and the output data transmitted to the data input/output interface 110, and then compares the input data and the output data to each other and thereby generating the comparison result CR. Specifically, the power supply voltage generating circuit 120 is configured to adjust the value of the supply voltage PV1 according to the comparison result CR if the comparison result CR indicates that there is at least one bit of different data existing between the aforementioned output data and the input data, due to the fact that the programming voltage required by less than four memory units 182 is different to that required by four memory units 182.

For example, if the comparison result CR indicates that there are two bits of different data existing between the aforementioned output data and the input data, the supply voltage generation circuit 120 is configured to lower the supply voltage PV1 to have a voltage value corresponding to the programming voltage required by two memory units 182. Consequently, the two memory units 182 stored with error data can process the program operation again according to the adjusted programming voltage so as to have the correct data stored therein. In other words, the supply voltage PV1 is adjusted based on the number of different bits. The more number of different bits that there are, the higher the supply voltage PV1 is to be; whereas, the less number of different bits that there are, the lower the supply voltage PV 1 thereby becomes. And, the different bits will not increase in the program sequence. In addition, it is understood that the comparison operation is performed on the aforementioned input data and the output data repeatedly until when there is no more of any bit of different data therebetween to be found. Moreover, the voltage level control unit 140 is not limited to receive the comparison result CR derived from the comparison unit 130 only; in other words, the voltage level control unit 140 may be configured to receive a comparison result CR' derived from outside of the memory 100 as depicted in FIG. 1. That is, the comparison result CR' is derived from outside of the memory 100 associated with the memory array 180.

Based on the aforementioned description, it is understood that the supply voltage generation circuit 120 is capable of dynamically adjusting the value of the supply voltage PV1 according to the load (that is, the number of the memory unit 182 required to be driven); and consequently, the supply voltage generation circuit 120 can provide more accurate supply voltage PV1 used as a programming voltage.

The circuit design of each component in the supply voltage generation circuit 120 is described in the following description. In addition, it is understood that the comparison unit 130 in FIG. 1 can compare the aforementioned input data and the output data to each other in a digital data comparison manner, analog-type current comparison manner or analog-type voltage comparison manner. One exemplified circuit design of the comparison unit 130 employing a digital data comparison manner is depicted in FIG. 2.

Figure 2:
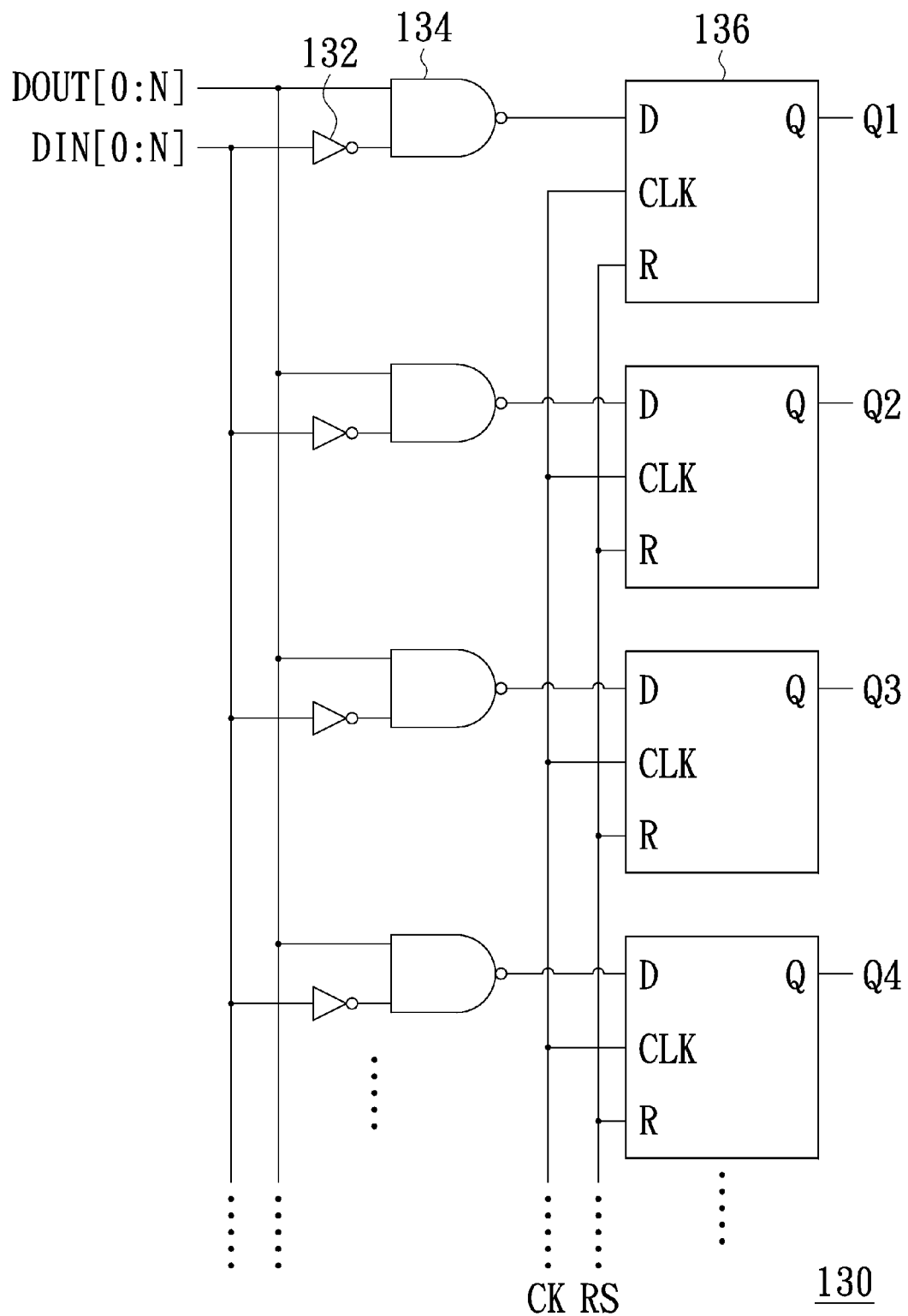
FIG. 2 is a schematic view illustrating an exemplified circuit structure of a comparison unit shown in FIG. 1.

FIG. 2 is a schematic view illustrating an exemplified circuit structure of the comparison unit 130 shown in FIG. 1. As shown, the comparison unit 130 includes a plurality of NOT gates 132, a plurality of NAND gates 134 and a plurality of D-type flip-flops 136. These NOT gates 132 are configured to have the input terminals thereof electrically coupled to each other and for receiving the input data DIN [0: N] of the memory array 180; wherein N is a natural number. The NAND gates 134 each are configured to have one input terminal thereof for receiving an output signal of one respective NOT gate 132 and another input terminal thereof electrically coupled to the another input terminals of the rest of the NAND gates 134 and for receiving the output data DOUT [0: N] of the memory array 180.

The D-type flip-flops 136 each have a data input terminal D, a clock signal input terminal CLK, a reset signal input terminal R and a data output terminal Q. Each D-type flip-flop 136 is configured to have the data input terminal D thereof for receiving an output signal of one respective NAND gate 134. These D-type flip-flops 136 are configured to have the clock signal input terminals CLK thereof for receiving a clock signal CK; wherein the clock signal CK is generated only when the aforementioned input data and the aforementioned output are required to be compared to each other. In addition, these D-type flip-flops 136 are configured to have the reset signal input terminals R thereof for receiving a reset signal RS. Each D-type flip-flop 136 is configured to have the data output terminal Q thereof for providing an output signal (such as the signals Q1~Q4); wherein these output signals of these D-type flip-flops 136 corporately form the comparison result CR. As illustrated in FIG. 2, the comparison unit 130 has a multi-stage circuit structure, and each stage of the circuit includes one NOT gate 132, one NAND gate 134 and one D-type flip-flop 136.

In addition, the voltage level control unit 140 in FIG. 1 may be stored with a lookup table (not shown), which records a mapping relationship between the number of memory units 182 required to process the program operation and the corresponding supply voltage PV1. Thus, the voltage level control unit 140 can generate the control signal CS according to a lookup result obtained from looking up the lookup table according to the comparison result CR.

Figure 3:
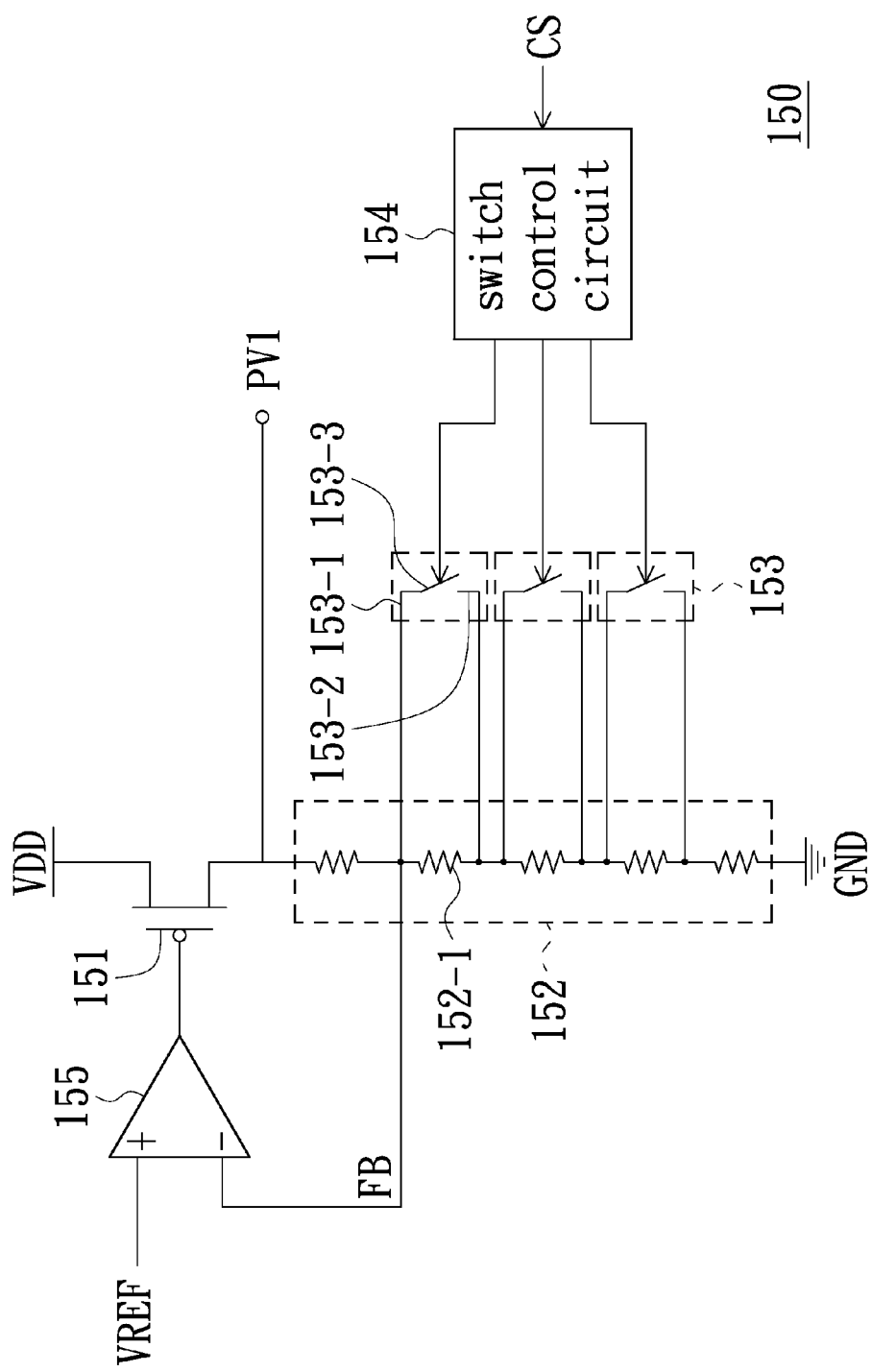
FIG. 3 is a schematic view illustrating an exemplified circuit structure of a voltage regulator circuit shown in FIG. 1.

The voltage regulator circuit 150 in FIG. 1 is, for example, realized by a low dropout regulator as illustrated in FIG. 3, which is a schematic view illustrating an exemplified circuit structure of the voltage regulator circuit 150. As shown, the voltage regulator circuit 150 includes a P-type transistor 151, a voltage divider circuit 152, a plurality of switches 153, a switch control circuit 154 and a voltage comparator 155. The P-type transistor 151 is configured to have one source/drain thereof electrically coupled to an operating power supply VDD and an another source/drain thereof for providing the supply voltage PV 1. The voltage divider circuit 152 includes a plurality of resistors 152-1 coupled in series and is configured to have one terminal thereof electrically coupled to the another source/drain of the P-type transistor 151 and an another terminal thereof electrically coupled to a reference voltage (e.g., a ground voltage GND).

In addition, each switch 153 has a first terminal 153-1, a second terminal 153-2 and a control terminal 153-3. Specifically, each switch 153 is configured to have the first terminal 153-1 and the second terminal 153-2 thereof electrically coupled to two terminals of one respective resistor 152-1 in the voltage divider circuit 152, respectively, and is selectively being turned on according to a signal received by the control terminal 153-3 thereof. Specifically, the switch control circuit 154 is electrically coupled to the control terminals 153-3 of the switches 153 and configured to selectively turn on the switches 153 according to the control signal CS outputted from the voltage level control unit 140. The voltage comparator 155 has a positive input terminal +, a negative input terminal − and an output terminal. The voltage comparator 155 is configured to have the positive input terminal + thereof for receiving a reference voltage VREF, the negative input terminal − thereof electrically coupled to an electrical connection node of two respective resistors 152-1 in the voltage divider circuit 152, and the output terminal thereof electrically coupled to the gate of the P-type transistor 151; wherein the electrical connection node is configured to provide a feedback signal FB.

Figure 4:
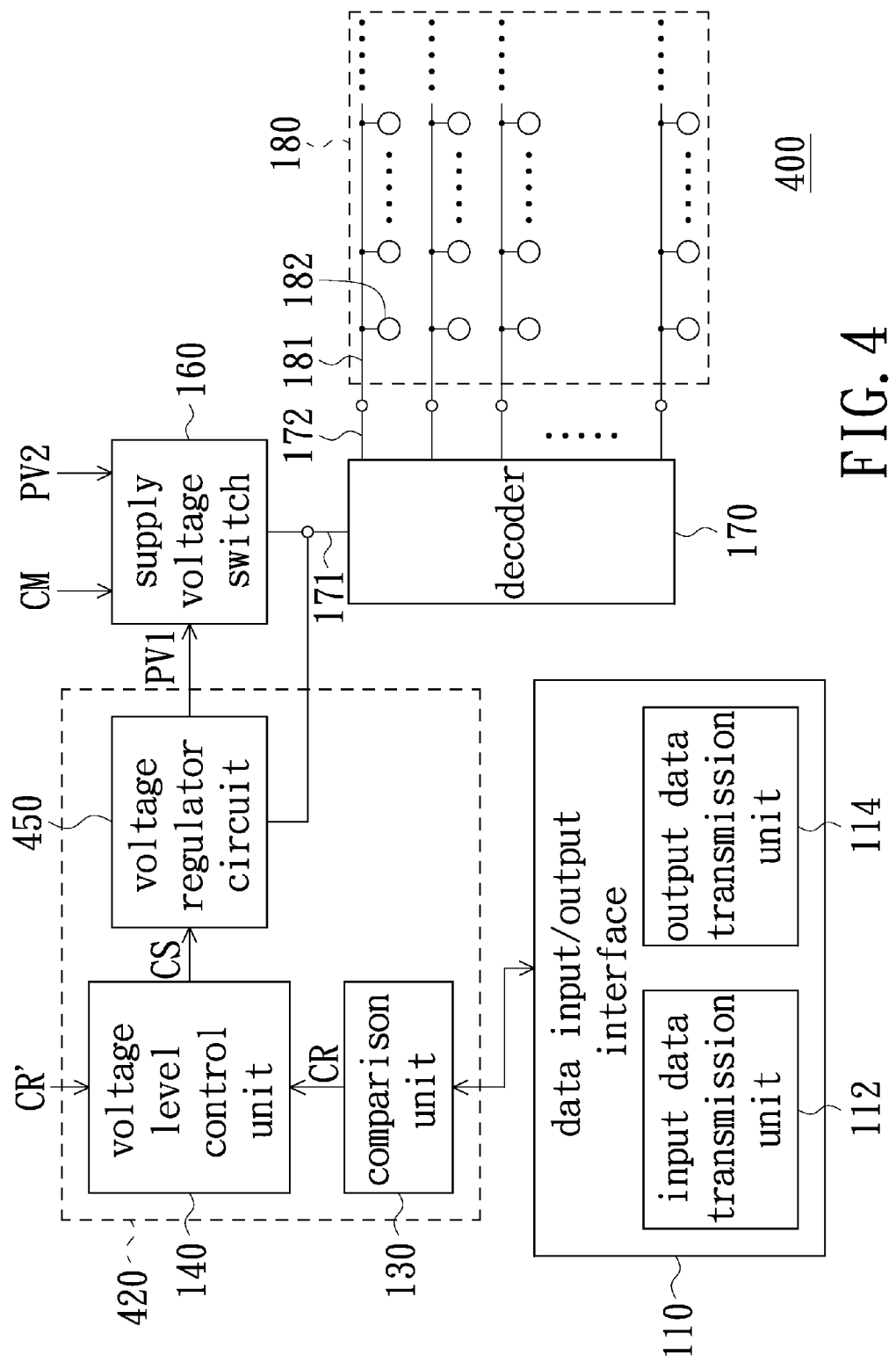
FIG. 4 is a schematic view of a memory array in accordance with another embodiment of the present invention.
Figure 6:
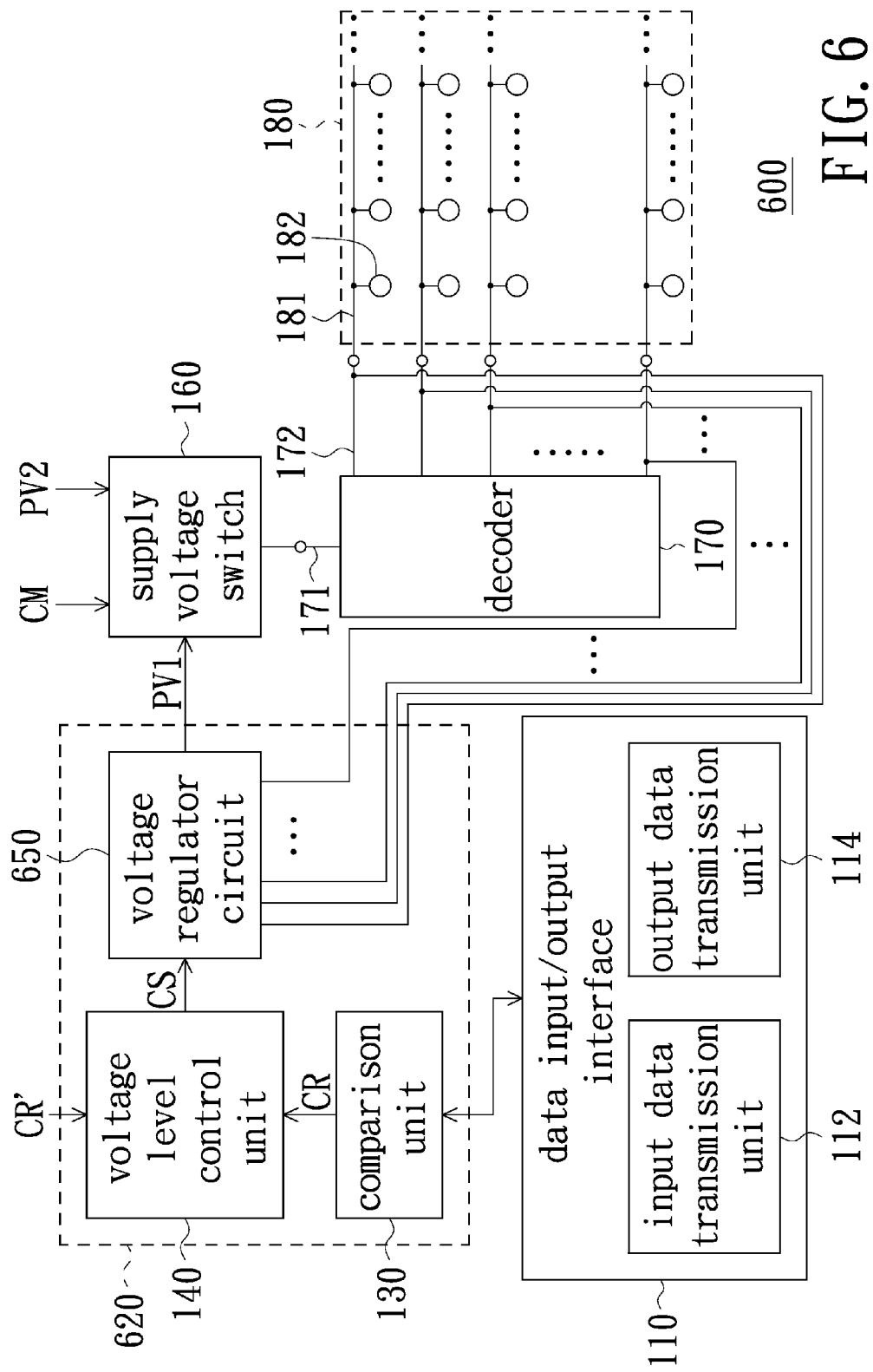
FIG. 6 is a schematic view of a memory array in accordance with still another embodiment of the present invention.

Additionally, in order to avoid the effect of the temperature/or manufacturing variations of the components, disposed on the transmission path of the programming voltage, on the programming voltage, the voltage regulator circuit in the power supply voltage regulator circuit associated with the present invention can employ various feedback manners, as the circuit designs illustrated in FIGS. 4, 6. FIG. 4 is a schematic view of a memory in accordance with another embodiment of the present invention; wherein it is to be noted that only a portion of the memory circuit structure associated with the present invention is depicted for brevity. The main difference between the memory 400 in this embodiment and the aforementioned memory 100 in aforementioned embodiment is that the voltage regulator circuit 450 of the supply voltage generation circuit 420 of the memory 400 is further electrically coupled to the input terminal 171 of the decoder 170 and is further configured to generate a feedback signal according to the signal received by the input terminal 171 of the decoder 170 and the control signal CS and consequently adjust the value of the supply voltage PV1 according to the feedback signal.

Figure 5:
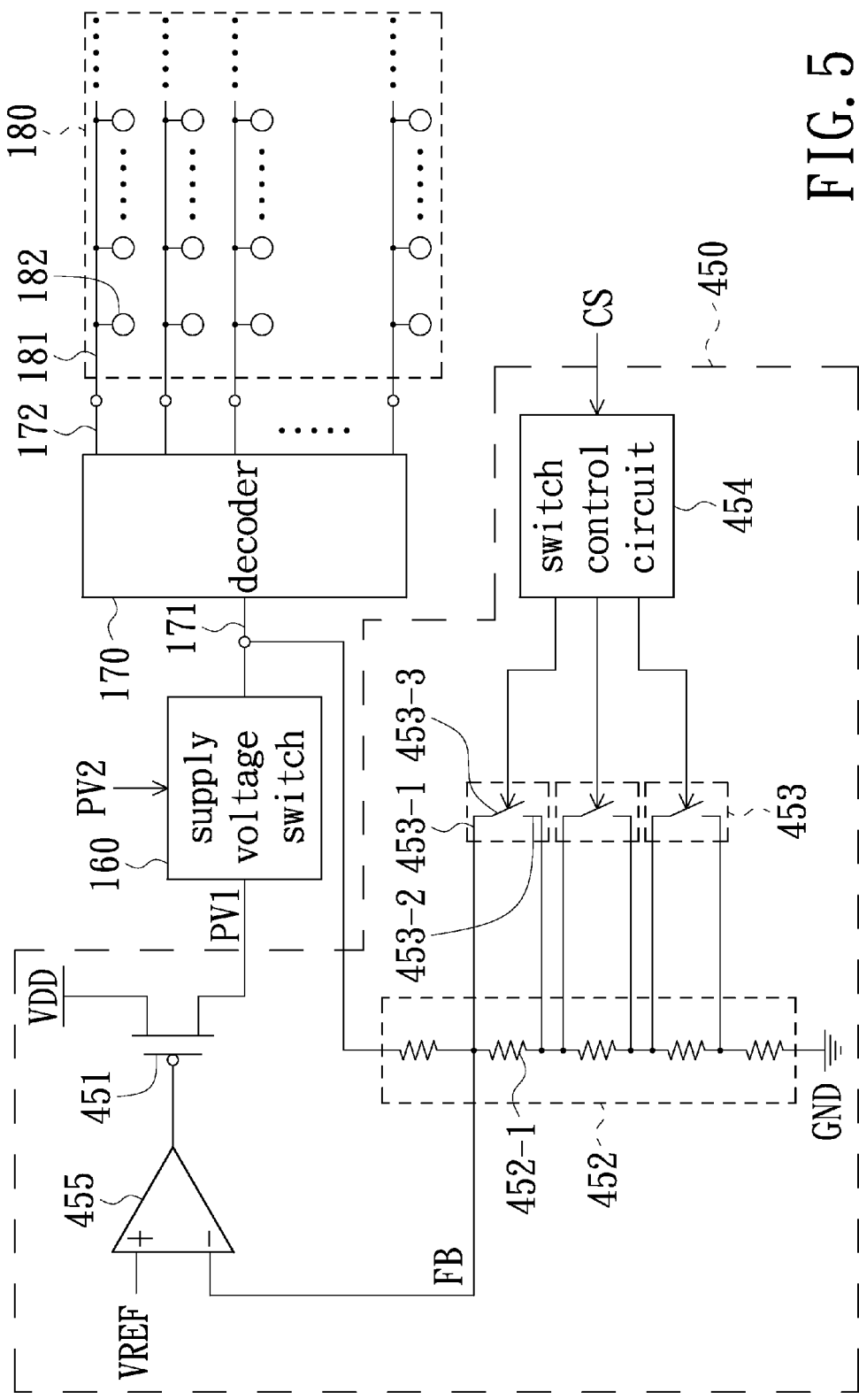
FIG. 5 is a schematic view illustrating an exemplified circuit structure of a voltage regulator circuit shown in FIG. 4.

FIG. 5 is a schematic view illustrating an exemplified circuit structure of the voltage regulator circuit 450 shown in FIG. 4. As shown, the voltage regulator circuit 450 includes a P-type transistor 451, a voltage divider circuit 452, a plurality of switches 453, a switch control circuit 454 and a voltage comparator 455. The P-type transistor 451 is configured to have one source/drain thereof electrically coupled to an operating power supply VDD and another source/drain thereof for providing the supply voltage PV1. The voltage divider circuit 452 includes a plurality of resistors 452-1 coupled in series and is configured to have one terminal thereof electrically coupled to the input terminal 171 of the decoder 170 and another terminal thereof electrically coupled to a reference voltage (e.g., a ground voltage GND).

In addition, the switches 453 each have a first terminal 453-1, a second terminal 453-2 and a control terminal 453-3. Specifically, each switch 453 is configured to have the first terminal 453-1 and the second terminal 453-2 thereof electrically coupled to two terminals of one respective resistor 452-1 in the voltage divider circuit 452, respectively. The switch control circuit 454 is electrically coupled to the control terminals 453-3 of the switches 453 and is configured to selectively turn on the switches 453 according to the control signal CS outputted from the voltage level control unit 140. The voltage comparator 455 has a positive input terminal +, a negative input terminal − and an output terminal. The voltage comparator 455 is configured to have the positive input terminal + thereof for receiving a reference voltage VREF, the negative input terminal − thereof electrically coupled to an electrical connection node of two specific resistors 452-1 in the voltage divider circuit 452, and the output terminal thereof electrically coupled to the gate of the P-type transistor 451; wherein the electrical connection node is configured to provide the aforementioned feedback signal FB.

FIG. 6 is a schematic view of a memory in accordance with still another embodiment of the present invention; wherein it is to be noted that only a portion of the memory circuit structure associated with the present invention is depicted. The main difference between the memory 600 in this embodiment and the aforementioned memory 100 is that the voltage regulator circuit 650 of the supply voltage generation circuit 620 of the memory 600 is further electrically coupled to each output terminal 172 of the decoder 170 and is further configured to generate a feedback signal according to a signal outputted from one of the output terminals 172 and the control signal CS and consequently adjust the value of the supply voltage PV1 according to the feedback signal.

Figure 7:
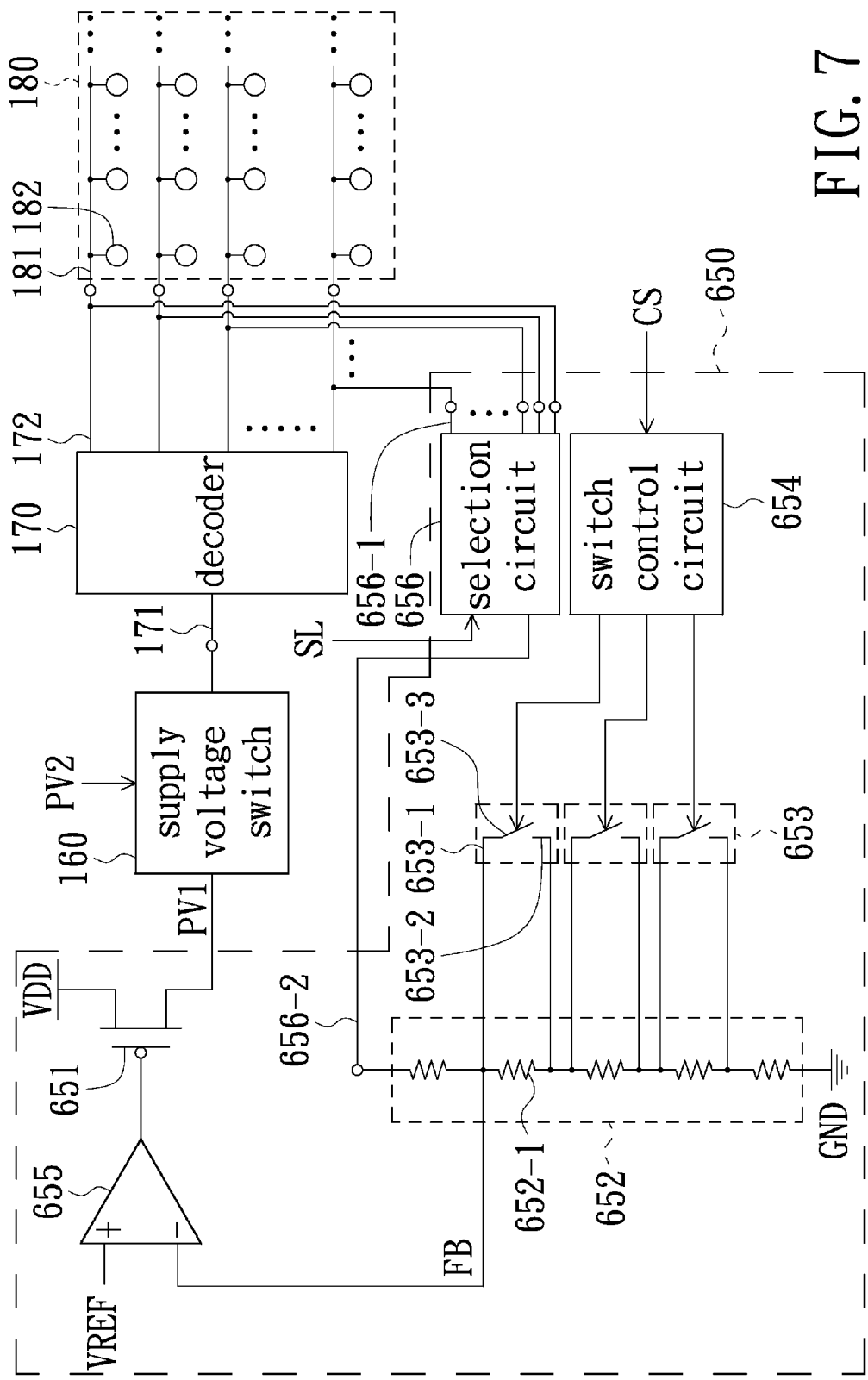
FIG. 7 is a schematic view illustrating an exemplified circuit structure of a voltage regulator circuit shown in FIG. 6.

FIG. 7 is a schematic view illustrating an exemplified circuit structure of the voltage regulator circuit 650 shown in FIG. 6. As shown, the voltage regulator circuit 650 includes a P-type transistor 651, a voltage divider circuit 652, a plurality of switches 653, a switch control circuit 654, a voltage comparator 655 and a selection circuit 656. The P-type transistor 651 is configured to have one source/drain thereof electrically coupled to an operating power supply VDD and another source/drain thereof for providing the supply voltage PV1. The selection circuit 656 has a plurality of input terminals 656-1 and an output terminal 656-2; wherein these input terminals 656-1 of the selection circuit 656 are electrically coupled to the output terminals 172 of the decoder 170, respectively. The selection circuit 656 is configured to select one of the input terminals 656-1 according to a selection signal SL and to output the signal received by the selected input terminal 656-1 through the output terminal 656-2 thereof.

In addition, the voltage divider circuit 652 includes a plurality of resistors 652-1 coupled in series. The voltage divider circuit 652 is configured to have one terminal thereof electrically coupled to the output terminal 656-2 of the selection circuit 656 and an another terminal thereof electrically coupled to a reference voltage (e.g., a ground voltage GND). The switches 653 each have a first terminal 653-1, a second terminal 653-2 and a control terminal 653-3. Specifically, each switch 653 is configured to have the first terminal 653-1 and the second terminal 653-2 thereof electrically coupled to two terminals of one respective resistor 652-1 in the voltage divider circuit 652, respectively. The switch control circuit 654 is electrically coupled to the control terminals 653-3 of the switches 653 and is configured to selectively turn on the switches 653 according to the control signal CS.

The voltage comparator 655 has a positive input terminal +, a negative input terminal − and an output terminal. The voltage comparator 655 is configured to have the positive input terminal + thereof for receiving a reference voltage VREF, the negative input terminal − electrically coupled to an electrical connection node of two specific resistors 652-1 in the voltage divider circuit 652, and the output terminal thereof electrically coupled to the gate of the P-type transistor 651; wherein the electrical connection node is configured to provide the aforementioned feedback signal FB.

Figure 8:
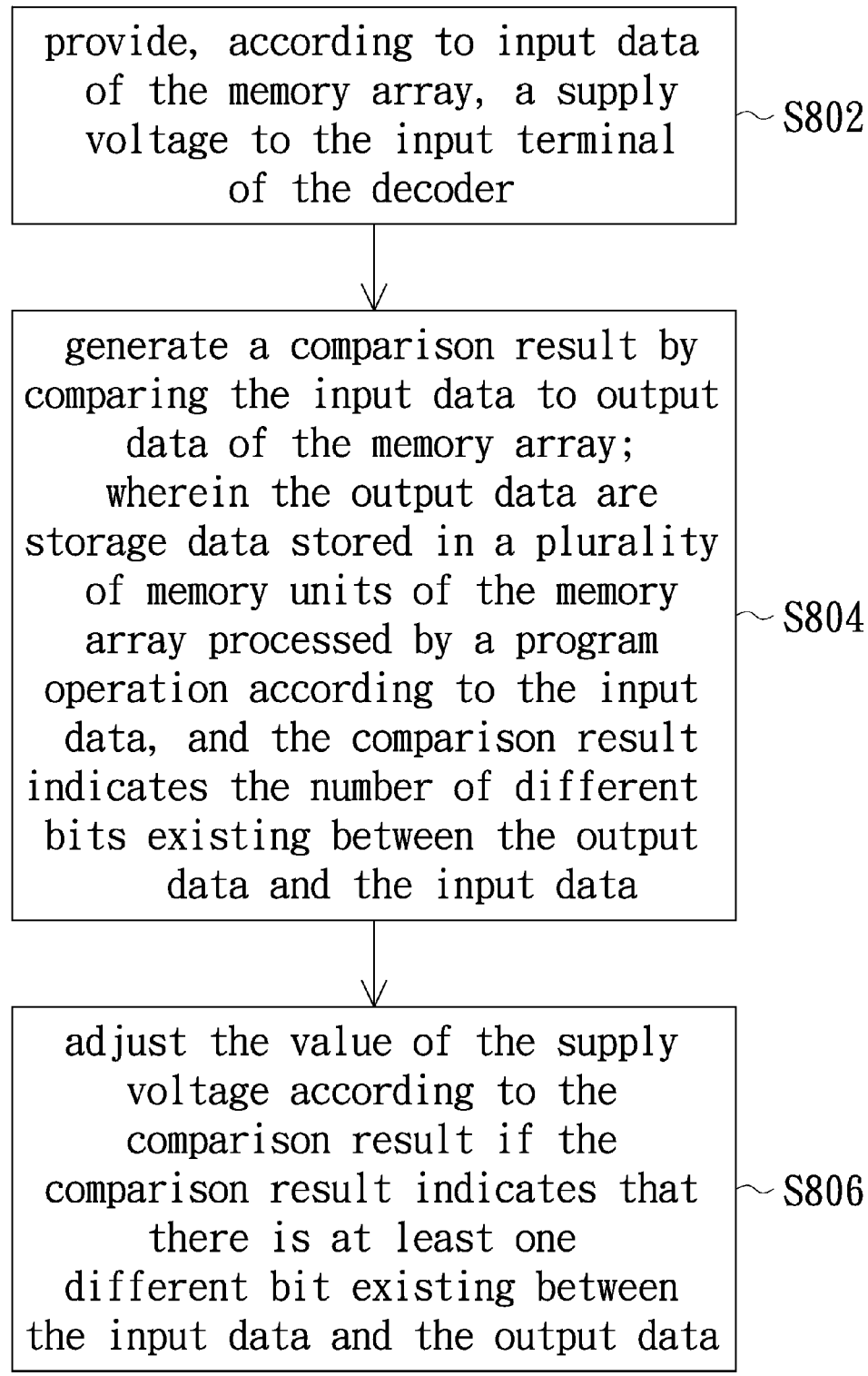
FIG. 8 is a schematic flow chart of an operation method of a supply voltage generation circuit in accordance with an embodiment of the present invention.

According to the descriptions of the aforementioned embodiments, an operation method of the aforementioned supply voltage generation circuits for a memory array can be summarized to have a plurality of basic operation steps by those ordinarily skilled in the art as illustrated in FIG. 8, which is a schematic flow chart of an operation method of a supply voltage generation circuit in accordance with an embodiment of the present invention. The memory array comprises a plurality of memory units and is electrically coupled to a decoder comprising an input terminal and a plurality of output terminals. Each output terminal of the decoder is electrically coupled to a respective group of the memory units. As shown in FIG. 8, the supply voltage generation method includes the following steps: providing, according to input data of the memory array, a supply voltage to the input terminal of the decoder (step S802); generating a comparison result by comparing the input data to output data of the memory array, wherein the output data are storage data stored in a plurality of memory units of the memory array processed by a program operation according to the input data, and the comparison result indicates the number of different bits existing between the output data and the input data (step S804); and adjusting the value of the supply voltage according to the comparison result if the comparison result indicates that there is at least one different bit existing between the input data and the output data (step S806).

In summary, the supply voltage generation circuit and the operation method of the supply voltage generation circuit according to the present invention first generates a comparison result by comparing input data to output data of a memory array; wherein the output data are storage data stored in a plurality of memory units of the memory array processed by a program operation according to the input data, and the comparison result indicates the number of different bits existing between the output data and the input data. Accordingly, the value of the supply voltage can be adjusted according to the comparison result if the comparison result indicates that there is at least one different bit existing between the input data and the output data. Thus, the supply voltage generation circuit and the operation method of the supply voltage generation circuit according to the present invention each are capable of providing a more accurate supply voltage used as a programming voltage.

Moreover, in the memory according to the present invention, the supply voltage generated by the voltage regulator circuit is used as a programming voltage. Because the voltage regulator circuit is further electrically coupled to the output terminals of the decoder and is configured to generate a feedback signal according to a signal outputted from one output terminal of the decoder and the control signal and consequently adjust the value of the supply voltage according to the feedback signal the voltage regulator circuit, the memory can avoid the effect of temperature and manufacturing variations of the components, disposed on the transmission path of the programming voltage, on the programming voltage.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An operation method of a supply voltage generation circuit used for a memory array, the memory array comprising a plurality of memory units and being electrically coupled to a decoder, the decoder comprising an input terminal and a plurality of output terminals, and each output terminal of the decoder being electrically coupled to a respective group of the memory units, the operation method comprising:
   providing, according to input data of the memory array, a supply voltage to the input terminal of the decoder;
   generating a comparison result by comparing the input data to output data of the memory array, wherein the output data are storage data stored in a plurality of memory units of the memory array processed by a program operation according to the input data, and the comparison result indicates the number of different bits existing between the output data and the input data; and
   adjusting the value of the supply voltage according to the comparison result if the comparison result indicates that there is at least one different bit existing between the input data and the output data.

2. The operation method according to claim 1, wherein the decoder comprises a source line decoder.

3. The operation method according to claim 1, wherein the comparison of the input data and the output data is realized by a digital data comparison manner, analog-type current comparison manner or analog-type voltage comparison manner.

* * * * *